(12) United States Patent
Lee et al.

(10) Patent No.: US 7,355,236 B2
(45) Date of Patent: Apr. 8, 2008

(54) NON-VOLATILE FLOATING GATE MEMORY CELLS WITH POLYSILICON STORAGE DOTS AND FABRICATION METHODS THEREOF

(75) Inventors: Tzyh-Cheang Lee, Hsinchu (TW); Fu-Liang Yang, Hsinchu (TW); Jiunn-Ren Hwang, Hsinchu (TW); Tsung-Lin Lee, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 90 days.

(21) Appl. No.: 11/313,790

(22) Filed: Dec. 22, 2005

(65) Prior Publication Data
US 2007/0145465 A1 Jun. 28, 2007

(51) Int. Cl.
*H01L 29/76* (2006.01)
(52) U.S. Cl. .............. 257/311; 257/315; 257/E29.129; 257/E29.309
(58) Field of Classification Search ............ 257/311, 257/E29.129, E29.309, 315
See application file for complete search history.

(56) References Cited

U.S. PATENT DOCUMENTS

| 5,029,130 | A | 7/1991 | Yeh |
| 6,011,725 | A | 1/2000 | Eitan |
| 6,706,599 | B1 * | 3/2004 | Sadd et al. .................. 438/261 |
| 6,806,531 | B1 | 10/2004 | Chen et al. |
| 6,861,315 | B1 | 3/2005 | Chen et al. |
| 6,913,975 | B2 | 7/2005 | Chen et al. |
| 7,191,830 | B2 * | 3/2007 | McVay et al. ............. 166/242.1 |
| 2006/0226466 | A1 * | 10/2006 | Schuler et al. .............. 257/315 |

OTHER PUBLICATIONS

Krivokapic et al., Quantum-well Memory Device (QWMD) with Extremely Good Charge Retention, IEDM, 2000, 185-188, IEEE.

* cited by examiner

*Primary Examiner*—Long K. Tran
(74) *Attorney, Agent, or Firm*—Birch, Stewart, Kolasch & Birch, LLP

(57) ABSTRACT

Non-volatile floating gate memory cells with polysilicon storage dots and fabrication methods thereof. The non-volatile floating gate memory cell comprises a semiconductor substrate of a first conductivity type. A first region of a second conductivity type different from the first conductivity type is formed in the semiconductor substrate. A second region of the second conductivity type is formed in the semiconductor substrate spaced apart from the first region. A channel region connects the first and second regions for the conduction of charges. A dielectric layer is disposed on the channel region. A control gate is disposed on the dielectric layer. A tunnel dielectric layer is conformably formed on the semiconductor substrate and the control gate. Two charge storage dots are spaced apart from each other at opposing lateral edges of the sidewalls of the control gate and surface of the semiconductor substrate.

5 Claims, 8 Drawing Sheets

US 7,355,236 B2

NON-VOLATILE FLOATING GATE MEMORY CELLS WITH POLYSILICON STORAGE DOTS AND FABRICATION METHODS THEREOF

BACKGROUND OF THE INVENTION

1. Field of the Invention

The present invention relates to electronic memory devices, and more particularly, to non-volatile floating gate memory cells with polysilicon storage dots and fabrication methods thereof.

2. Description of the Related Art

Non-volatile floating gate memories, such as silicon-oxide-nitride-oxide-silicon (SONOS) flash memories has attracted attention due to the numerous significant advantages they provide such as non-volatility, excellent scalability, electrical program/erase capability, high density, low power consumption, potential dual-bit-per-cell operation mode, and shock resistance. There are still some efficiency and reliability issues remaining, however, such as poor charge-trapping efficiency and short retention, before related technologies can be exploited.

FIG. 1 is a cross-section of a conventional SONOS memory cell fabricated by a standard CMOS process on a single crystalline silicon substrate. A tunnel oxide layer 12 is formed on a substrate 10 by dry oxidation. A silicon nitride layer 14 is formed on the tunnel oxide layer 12 by a low-pressure chemical vapor deposition (LPCVD). A blocking oxide layer 16 is formed on the silicon nitride layer 14 by LPCVD TEOS. A control gate 20 is formed on the blocking oxide layer 16. Source/drain regions 22 and 24, a passivation layer, contact hole formation and the rest of the process follow a standard MOSFET procedure in order.

Bi-directional read/program non-volatile memory cells capable of storing a plurality of bits in a single cell are also well known in the art. U.S. Pat. No. 6,011,725, the entirety of which is hereby incorporated by reference, discloses a two bit non-volatile electrically erasable and programmable semiconductor memory cell. FIG. 2, a cross-section of a conventional two bit non-volatile electrically erasable and programmable semiconductor memory cell, shows an area of charge trapping under the gate 60 for both the right and the left bits 55a and 55b. An insulating trapping material 54, such as silicon nitride, is typically disposed between two other insulation layers 52 and 56, such as silicon dioxide, to trap charges. The charges are trapped near the source/drain 70 and 80 also to control the conduction of charges in a channel of a transistor. The cell is read in one direction to determine the state of charges trapped near one of the source/drain regions, and is read in the opposite direction to determine the state of charges trapped near the other source/drain region. Hence, these cells are read and programmed bi-directionally. Since the programming and erasing charges are injected into a non-conductive trapping material, the charges do not move as in a conductive material. Moreover, as the channel length shrinks, the charge trapping area may punch through, causing unreliable device performance.

In an article entitled "Quantum-well Memory Device (QWMD) with Extremely Good Charge Retention" by Z. Krivokapic et al., published by IEEE in 2002, the authors disclose a memory device using floating gates as quantum wells. This memory device, however, is very different from a conventional non-volatile memory cell with spaced apart regions and a channel therebetween for the conduction of charges.

FIGS. 3A-3E are cross-sections of fabrication steps for a conventional bi-directional non-volatile memory cells using polysilicon dots as trapping charge materials. Referring to FIG. 3A, a gate oxide layer 110 is formed on a semiconductor substrate 100 by dry oxidation. A polysilicon silicon layer 120 is formed on the gate oxide layer 110 by chemical vapor deposition (CVD). An implantation procedure is then performed to form heavily doped N type Source/drain regions 122 and 124 in areas not covered by polysilicon gate structure 120.

Referring to FIG. 3B, an isotropic etching such as wet etching is performed by dipping in an HF solution. A portion of gate oxide at the edge of the gate structure is etched, creating a gap 115.

Referring to FIG. 3C, a thin silicon oxide layer 130, obtained using rapid process oxidation (RPO) or via LPCVD or PECVD procedures, at a thickness between about 300 to 400 Å, is conformably formed on the surface of polysilicon layer 120 and the semiconductor substrate 100.

Referring to FIG. 3D, a second polysilicon layer 140 is formed on the substrate 100 filling the gap 115. The second polysilicon 140 can be doped in situ, during deposition, via the addition of arsine, or phosphine, to a silane ambient, or the polysilicon layer can be deposited intrinsically then doped via implantation of arsenic or phosphorous ions.

Referring to FIG. 3E, an annealing cycle, performed using conventional furnace procedures or using a rapid thermal annealing procedure at a temperature between about 650 to 800° C., to form a silicon oxide layer 140' and leave un-reacted polysilicon dots in each gap between the polysilicon gate 120 and the semiconductor substrate 100.

The annealing procedure is critical to controlling oxidation of the polysilicon layer 140. The un-reacted polysilicon dots 140a and 140b may be affected by temperature and duration of the annealing procedure. Moreover, the conventional method requires an additional etching to form a gap 115. The dimension of the gap 115 is difficult to control as channel length of the memory cell shrinks, complicating related processes. Moreover, as the channel length shrinks, the poly dots 140a and 140b are difficult to separate, thereby the memory cell structure is intricate.

BRIEF SUMMARY OF THE INVENTION

The invention provides a non-volatile floating gate memory cell with polysilicon storage dots and a fabrication method thereof. Two polysilicon storage dots are operatively separated as wide as the width of the control gate structure.

The invention provides a non-volatile floating gate memory cell comprising a semiconductor substrate of a first conductivity type. A first region of a second conductivity type different from the first conductivity type is formed in the semiconductor substrate. A second region of the second conductivity type is formed in the semiconductor substrate spaced apart from the first region. A channel region connects the first and second regions for the conduction of charges. A dielectric layer is disposed on the channel region. A control gate is disposed on the dielectric layer. A tunnel dielectric layer is conformably formed on the semiconductor substrate and the control gate. Two charge storage dots are spaced apart from each other at opposing lateral edges of the sidewalls of the control gate and surface of the semiconductor substrate.

The invention further provides a method of forming a non-volatile floating gate memory cell. A semiconductor substrate of a first conductivity type is provided. A dielectric layer is formed on the semiconductor substrate. A first semiconductor layer is formed on the dielectric layer. The first semiconductor layer and the dielectric layer are patterned into a control gate structure. A tunnel oxide is conformably formed on the semiconductor substrate and the control gate structure. A second semiconductor layer is formed on the tunnel oxide. The second semiconductor layer is patterned and oxidized leaving two un-reacted semiconductor dots at opposing lateral edges of the sidewalls of the control gate structure and surface of the semiconductor substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the subsequent detailed description and the accompany in drawings, which are given by way of illustration only, and thus are not limitative of the present invention and wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
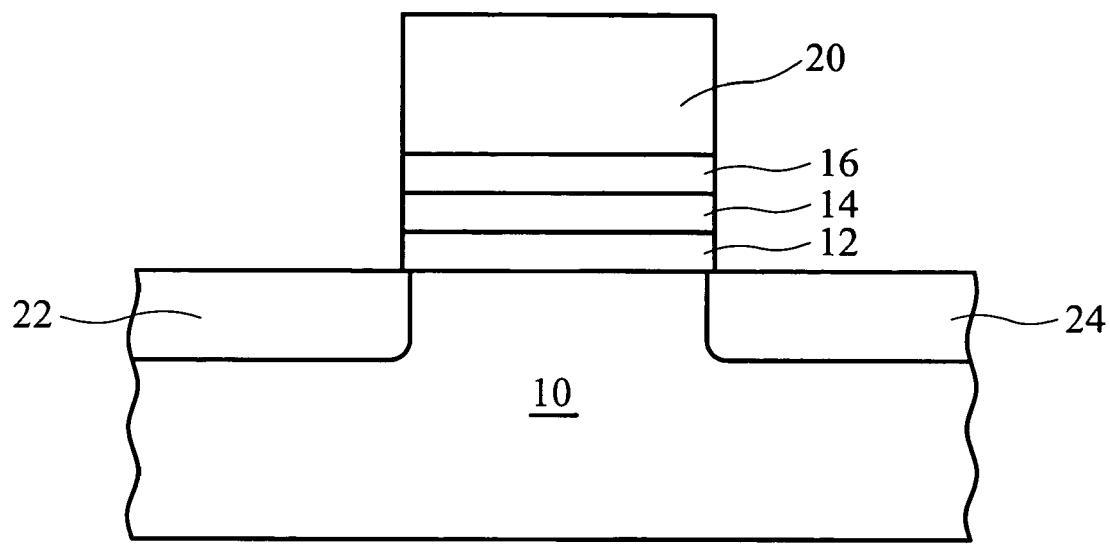
FIG. 1 is a cross-section of a conventional SONOS memory cell which is fabricated by standard CMOS process on a single crystalline silicon substrate.
Figure 2:
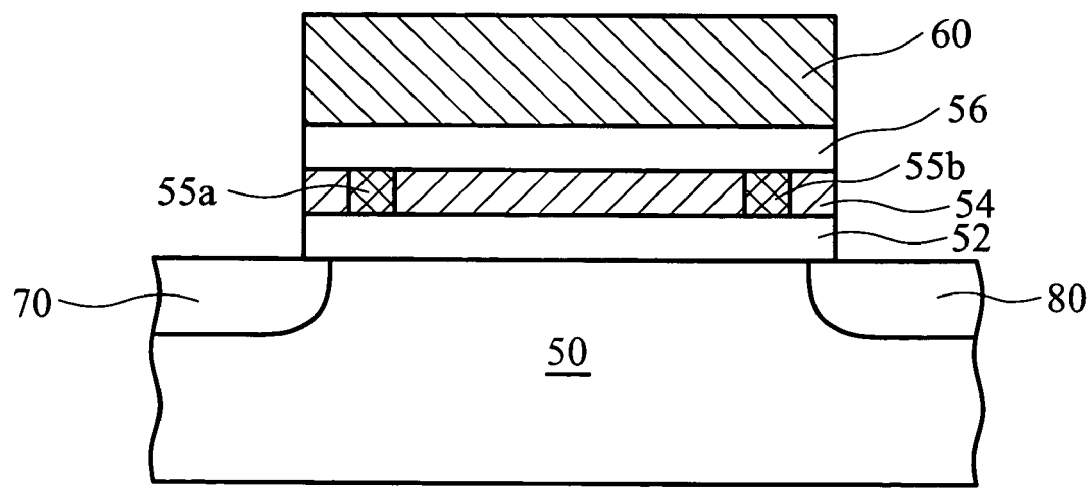
FIG. 2 is a cross-section of a conventional two bit non-volatile electrically erasable and programmable semiconductor memory cell.
Figure 3A:
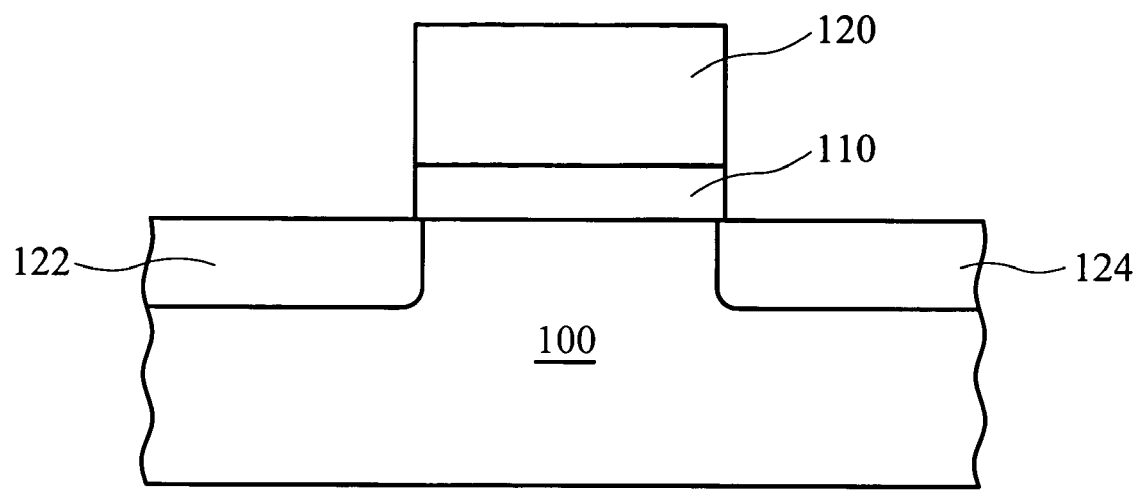
FIGS. 3A-3E are cross-sections of the steps of fabricating conventional bi-directional non-volatile memory cells using polysilicon dots as trapping charge materials.
Figure 3B:
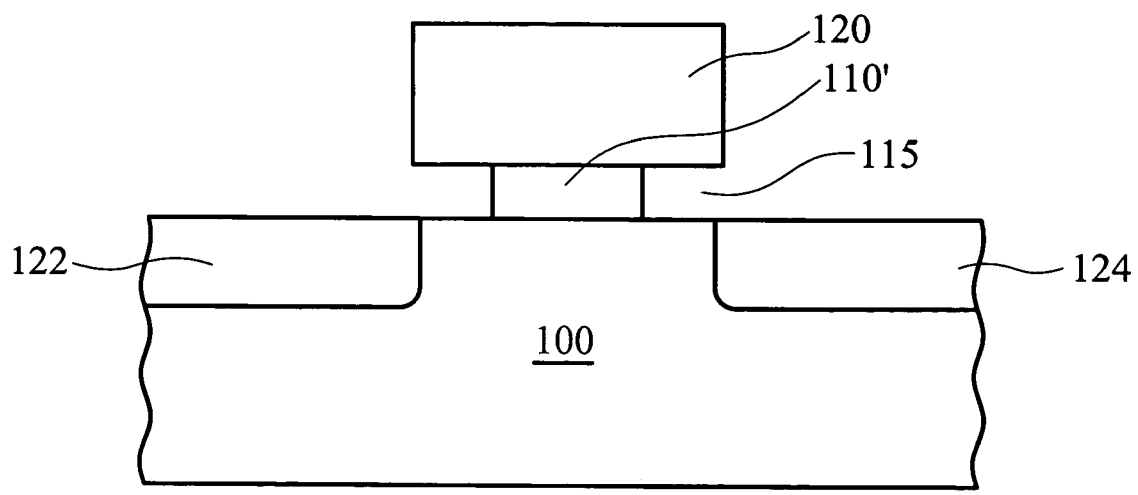
Figure 3C:
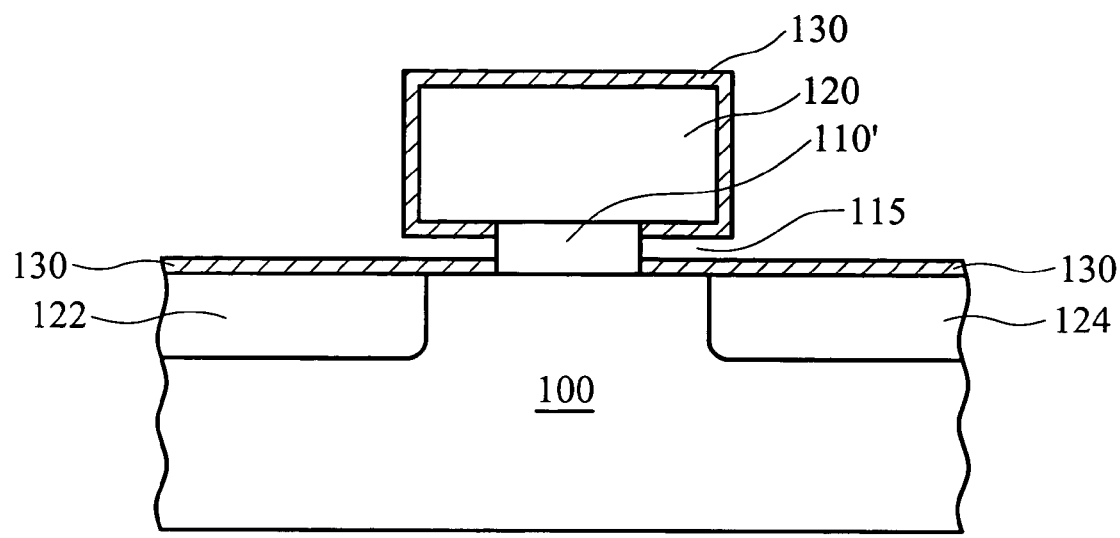
Figure 3D:
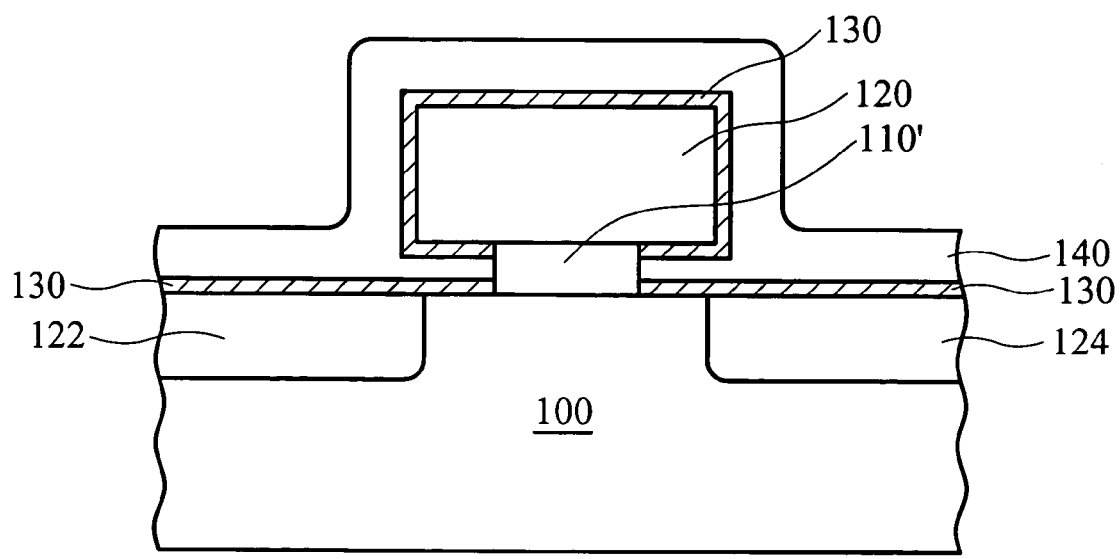
Figure 3E:
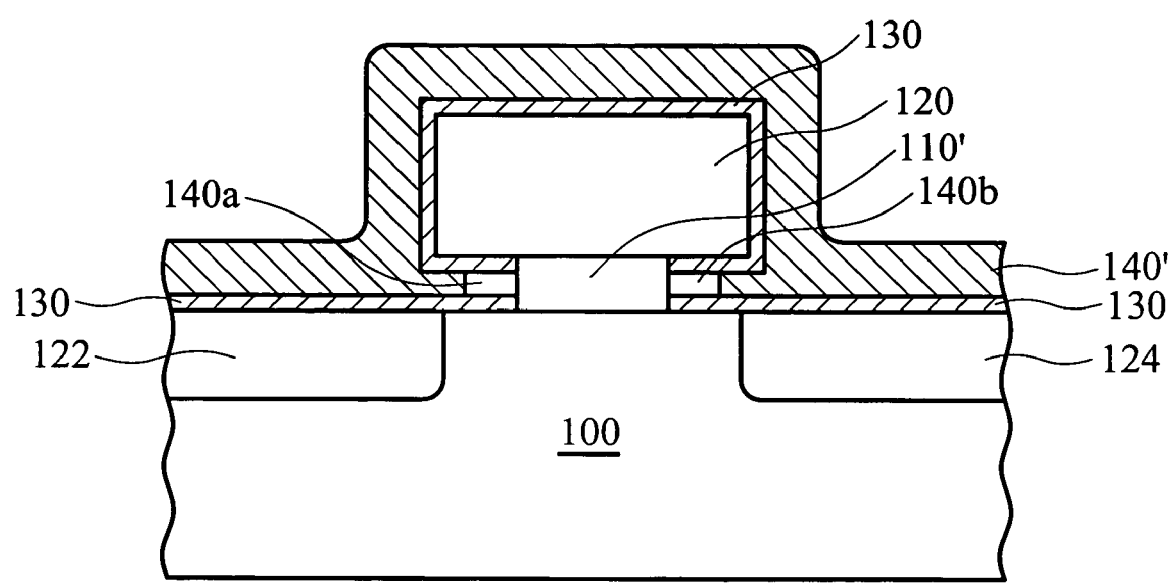
Figure 4A:
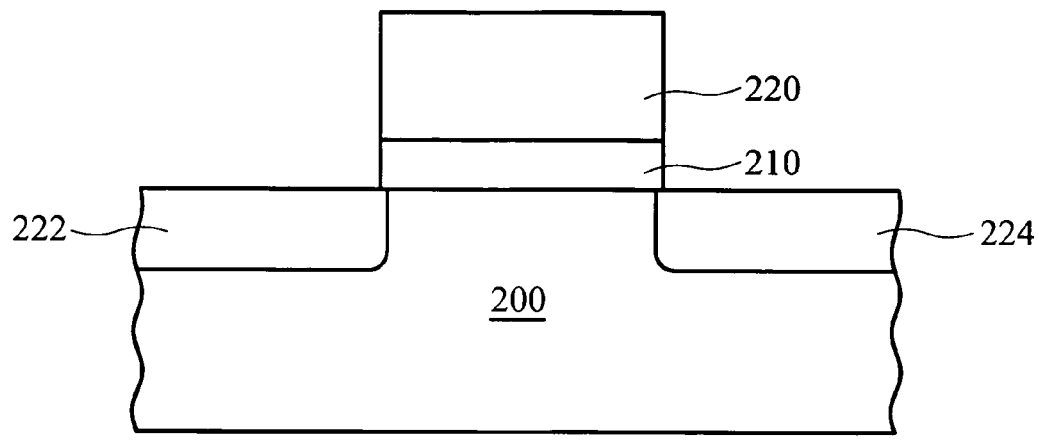
FIGS. 4A-4D are cross-sections illustrating fabrication steps of an embodiment of a non-volatile floating gate memory cell with polysilicon storage dots.

FIGS. 4A-4D are cross-sections illustrating steps of fabricating an embodiment of a non-volatile floating gate memory cell with polysilicon storage dots. Referring to FIG. 4A, a semiconductor substrate 200, such as a P type semiconductor substrate, comprised of a single crystalline silicon wafer with a <100> crystallographic orientation, is provided. A gate oxide layer 210 is formed on the semiconductor substrate 210 by dry oxidation. A polysilicon gate 220, such as a $PH_3$-doped polysilicon, is formed on the gate oxide layer 210. The polysilicon gate 220 and gate oxide 210 are patterned into a control gate structure. An implantation procedure is then performed, using arsenic or phosphorous ions at a doping energy between about 35 to 50 KeV, at a dose between about $1\times10^{14}$ and $6\times10^{15}$ atoms/cm$^2$, forming heavily doped, N type source/drain regions 222 and 224 in areas not covered by the control gate structure.

Figure 4B:
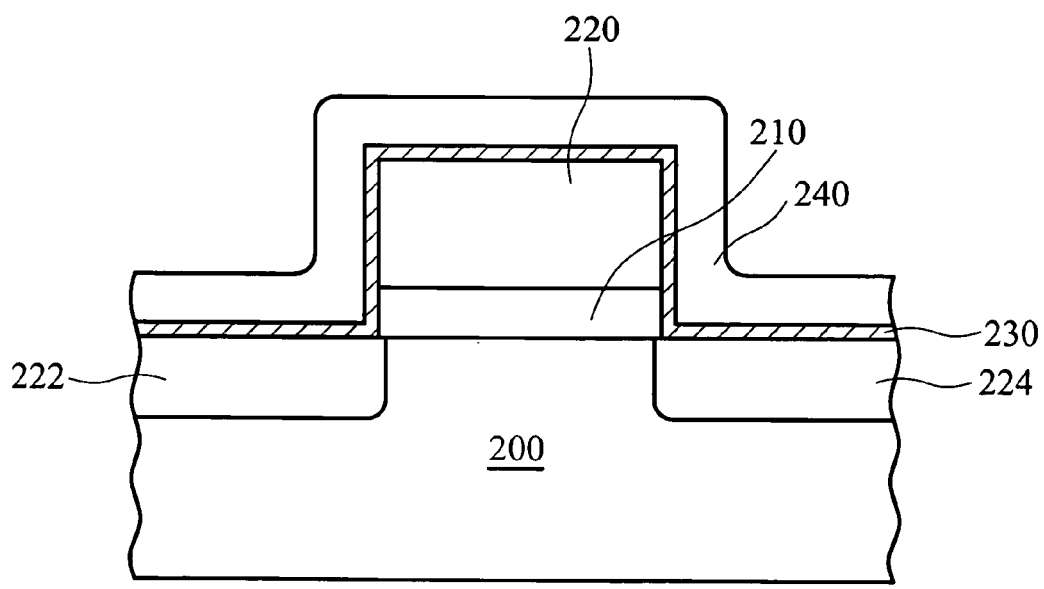

Referring to FIG. 4B, a thin tunnel silicon oxide layer 230, obtained using rapid process oxidation (RPO) or obtained via low pressure chemical vapor deposition (LPCVD) or plasma enhance chemical vapor deposition (PECVD) procedures, at a thickness between about 300 and 400 Å, is conformably formed on the control gate structure and the semiconductor substrate 200.

A second polysilicon layer 240 is conformably formed on the thin tunnel silicon oxide layer 230. The second polysilicon layer 240 can be doped in situ during deposition, via the addition of arsine or phosphine to a silane ambient. Alternatively, the polysilicon layer 240 can be deposited intrinsically then doped via implantation of arsenic or phosphorous ions.

Figure 4C:
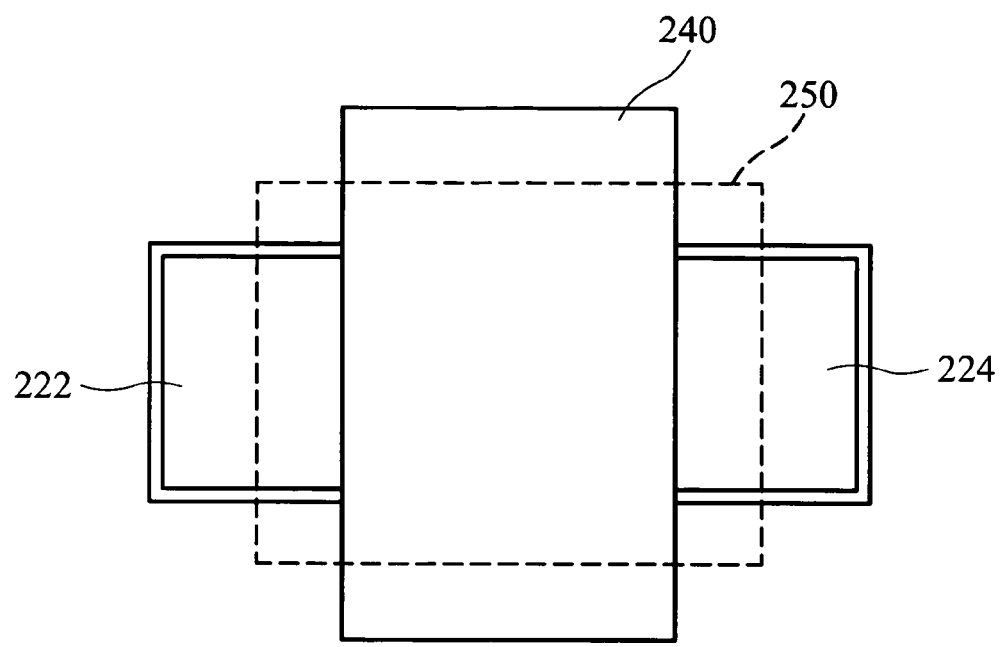

FIG. 4C is a plan view of schematically illustrating the second polysilicon layer 240 etched by lithography. A photo mask 250 is formed on the control gate structure. A reactive ion etching (RIE) procedure, using $Cl_2$ or $SF_6$ as an etchant, is used to etch the second polysilicon 240, defining a polysilicon structure.

Figure 4D:
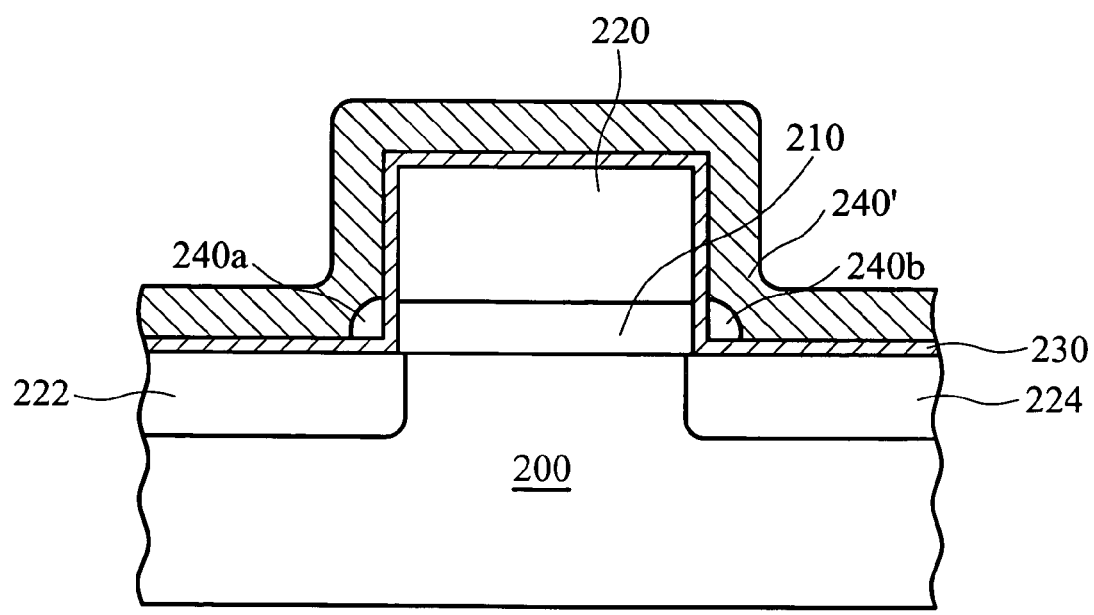

Referring to FIG. 4D, an annealing cycle, performed using conventional furnace procedures, or using a rapid thermal annealing procedure, at a temperature between about 650 to 800° C., is employed to form a silicon oxide layer 240' and leaving un-reacted polysilicon dots 240a and 240b at opposing lateral edges of the sidewalls of the polysilicon gate 220 and surface of the semiconductor substrate 200. The polysilicon dots 240a and 240b serve as charge storage dots which are operatively separated as wide as the width of the control gate structure.

The annealing procedure is critical in controlling oxidation of the polysilicon layer 240. The un-reacted polysilicon dots 240a and 240b may be affected by the temperature and duration of the annealing procedure. Nano-scale polysilicon dots are preferred for application in non-volatile memory cells. If the second polysilicon layer 240 is too thick, an optional etch back procedure is required to optimize dimensions of the polysilicon dots.

Figure 5A:
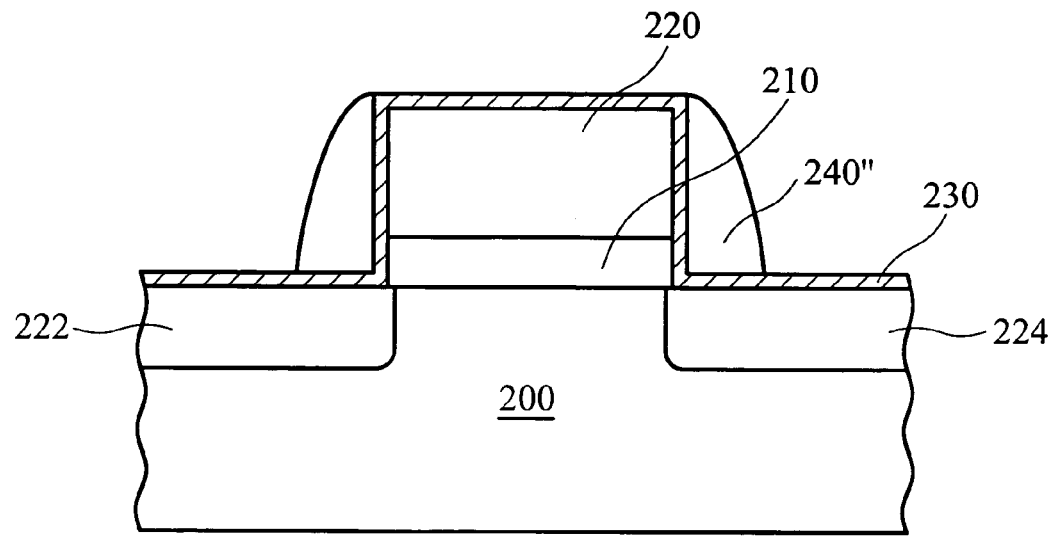
FIGS. 5A-5C are cross-sections illustrating fabrication steps of another embodiment of a non-volatile floating gate memory cell with polysilicon storage dots.
Figure 5B:
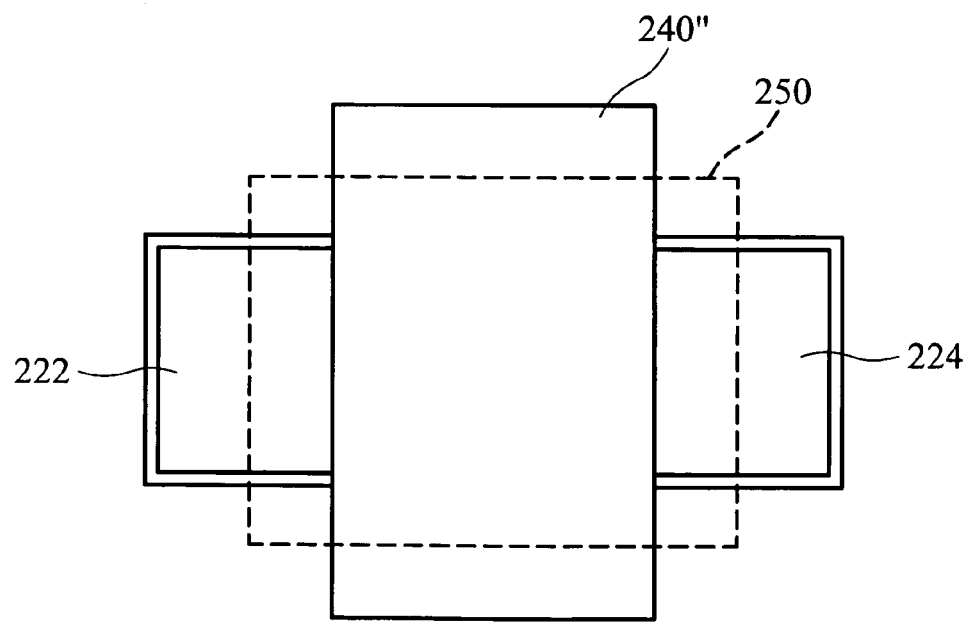
Figure 5C:
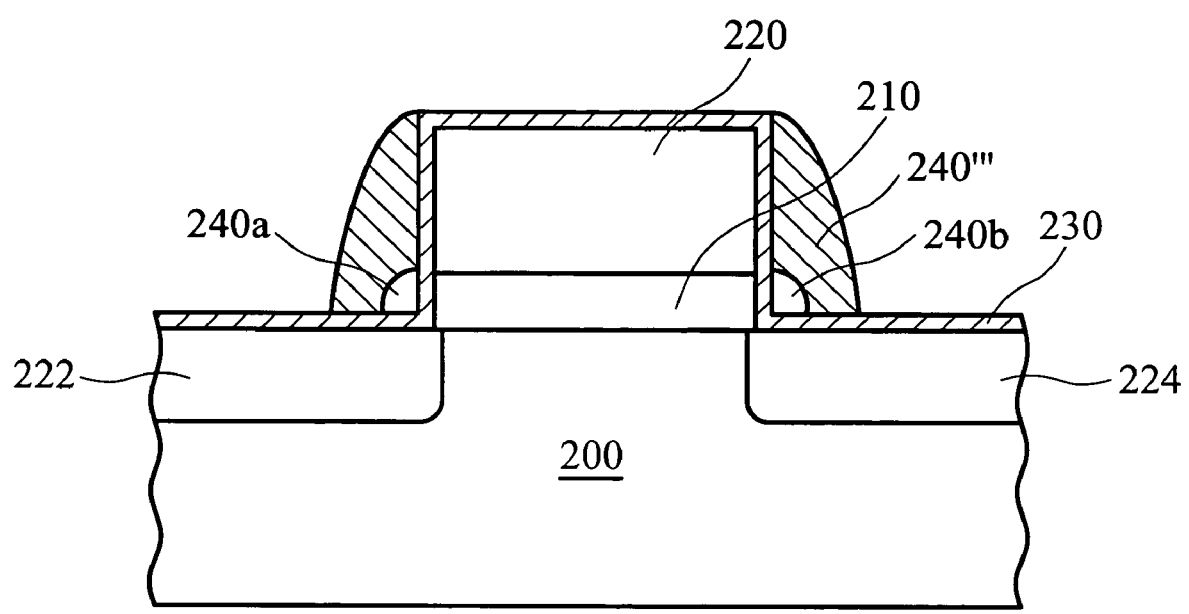

FIGS. 5A-5C are cross-sections illustrating fabrication steps of another embodiment of a non-volatile floating gate memory cell with polysilicon storage dots. Referring to FIG. 5A, before the second polysilicon layer 240 is annealed, a critical anisotropic etch back procedure is performed via RIE procedures using oxygen as an etchant. The etch back procedure is terminated at the point in which the portion of second polysilicon layer 240" resides on the sidewall of polysilicon gate structure 220.

Referring to FIG. 5B, the second polysilicon layer is etched by lithography. A photo mask 250 is formed on the control gate structure. A reactive ion etching (RIE) procedure, using $Cl_2$ or $SF_6$ as an etchant, is used to etch the second polysilicon 240''', defining a polysilicon structure.

Referring to FIG. 5C, an annealing cycle, performed using conventional furnace procedures or using a rapid thermal annealing procedure, at a temperature between about 650 to 800° C., is employed to form a silicon oxide layer 240''' leaving un-reacted polysilicon dots 240a and 240b at opposing lateral edges of the sidewalls of the polysilicon gate 220 and surface of the semiconductor substrate 200. The polysilicon dots 240a and 240b are served as charge storage dots which are operatively separated as wide as the width of the control gate structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile floating gate memory cell, comprising:
   a semiconductor substrate of a first conductivity type;
   a first region of a second conductivity type different from the first conductivity type;
   a second region of the second conductivity type spaced apart from the first region;
   a channel region connecting the first and second regions for the conduction of charges;
   a dielectric layer on the channel region;
   a control gate on the dielectric layer;
   a tunnel dielectric layer conformably covered the semiconductor substrate and the control gate; and
   two semiconductor charge storage dots on the tunnel dielectric layer and spaced apart each other at opposing lateral edges of the sidewalls of the control gate, wherein the semiconductor charge storage dots are isolated from the semiconductor substrate and the control gate with the tunnel dielectric layer.

2. The non-volatile floating gate memory cell as claimed in claim 1, wherein the two semiconductor charge storage dots comprise two polysilicon dots.

3. The non-volatile floating gate memory cell according to claim 1, wherein the two semiconductor charge storage dots are operatively separated as wide as the width of the control gate.

4. The non-volatile floating gate memory cell according to claim 1, further comprising an oxide layer on the tunnel dielectric layer and the two semiconductor charge storage dots.

5. The non-volatile floating gate memory cell according to claim 1, further comprising two oxide spacers formed on the tunnel dielectric layer at the sidewalls of the control gate and covering the two semiconductor charge storage dots.

* * * * *